Dec. 22, 1970 R. R. SINUSAS 3,550,040
DOUBLE-BALANCED MODULATOR CIRCUIT READILY ADAPTABLE TO INTEGRATED CIRCUIT FABRICATION
Filed May 31, 1968 4 Sheets-Sheet 1

INVENTOR
ROBERT R. SINUSAS
BY Harold R. Patton
ATTORNEY

Dec. 22, 1970 R. R. SINUSAS 3,550,040

DOUBLE-BALANCED MODULATOR CIRCUIT READILY ADAPTABLE TO INTEGRATED CIRCUIT FABRICATION

Filed May 31, 1968 4 Sheets-Sheet 2

INVENTOR
ROBERT R. SINUSAS
BY [signature]
ATTORNEY

INVENTOR
ROBERT R. SINUSAS
BY Harold R. Patton
ATTORNEY

INVENTOR
ROBERT R. SINUSAS

United States Patent Office 3,550,040
Patented Dec. 22, 1970

3,550,040

DOUBLE-BALANCED MODULATOR CIRCUIT READILY ADAPTABLE TO INTEGRATED CIRCUIT FABRICATION

Robert R. Sinusas, West Caldwell, N.J., assignor to Monsanto Company, St. Louis, Mo., a corporation of Delaware Continuation-in-part of application Ser. No. 620,890, Mar. 6, 1967. This application May 31, 1968, Ser. No. 736,543
Int. Cl. H03c 1/54
U.S. Cl. 332—44 10 Claims

ABSTRACT OF THE DISCLOSURE

The disclosure of the present invention includes a circuit having three pairs of transistors each having their emitter electrodes coupled together capable of operating as a double balanced modulator and signal level multiplier. The emitter electrodes of one transistor pair are connected to a common, relatively constant current source (such as a large value resistor connected to a high voltage supply); this maintains a constant current. In this manner, a signal applied to this pair of transistors produces current signals which are out of phase with each other. The two current signals are applied to the emitters of the transistors of the remaining pairs, respectively, and are divided between the transistors of these pairs depending on the instantaneous amplitude of a second signal supplied thereto. This provides balanced currents in two output impedances and assures that the output signal taken across either impedance will contain only the product signals.

RELATED APPLICATIONS

The present application is a continuation-in-part of application Ser. No. 620,890, entitled "Double Balanced Modulator Circuit" and filed Mar. 6, 1967 now abandoned.

INTRODUCTION

The present invention relates generally to modulator-mixer circuits, and more particularly to a double-balanced modulator-mixer circuit, wherein two input signals are combined to provide an output signal including only the sideband signals.

In certain circuit applications, it is oftentimes necessary to mix or modulate electrical signals of different frequencies to obtain a resultant frequency of a desired frequency. For example, in frequency synthesis applications, readily available signals having different frequencies are fed to a modulator and mixed to provide desired sidebands thereof. Oftentimes the frequency of the available signals and harmonics thereof are not sufficiently spaced in frequency from the desired sidebands to permit facile filtering.

Heretofore, it has been the general practice to employ complex, expensive filter networks to filter out the desired sidebands from the closely spaced modulating signal, carrier signal, or harmonics thereof. Another approach is to employ double-balanced modulators including precision-built, balanced transformers. Such transformers often require calibration and adjustment for proper operation, especially under conditions where the input signal frequencies are varied; in addition, periodic adjustment is often required over the extended operation of circuits employing such transformers.

Although such modulator circuits have served the purpose for particular applications, they have not proved satisfactory under all conditions of service for the reasons that (1) modulator circuits heretofore employing complex filter networks have proven prohibitive in cost where multiple mixing operations are required, and (2) double-balanced modulator circuits employing special transformers require frequent adjustment and are not readily susceptible to integrated circuit fabrication.

In accordance with the present invention, a double-balanced modulator circuit is provided which embraces the advantages of similarly employed prior art modulators, yet does not possess the foredescribed disadvantages. To attain this, the present invention utilizes a unique combination of three transistor pairs, so arranged as to mix the input signals supplied to the double-balanced modulator and provide an output signal consisting only of the desired sideband signal.

As is well known, a modulator may be used as a phase detector by applying equal frequencies (or signals having equal frequency components or harmonics) to the two inputs of the modulator. The lower sideband which will be in the zero frequency range is passed to the output to the exclusion of all other frequencies resulting in an output level dependent upon phase difference. With the present modulator, excluding all other frequencies presents a simpler filtering problem than that presented by prior art modulators, due to the suppression of the input frequencies.

The circuit of the present invention also uniquely operates as a voltage level multiplier to provide an output which is substantially proportional to the product of the input signal levels.

BRIEF DESCRIPTION OF THE INVENTION

In the present invention these purposes (as well as others apparent herein) are achieved generally by providing a double-balanced modulator circuit including first and second input terminals to which the two signals to be mixed are applied. Means are electrically connected to the first input terminal for generating first and second current signals which correspond to one of the input signals. The current signals, so generated, are phase shifted with respect to each other. First and second proportioning circuits are electrically connected to receive the first and second phase-shifted signals, respectively, and selectively apply them to two load impedance circuits in accordance with the second input signal, which controls the actuation of the proportioning circuits. In this manner, the two input signals are combined in such a manner that the output signals taken from one of the impedance circuits consists solely of the product signals.

DESCRIPTION OF THE FIGURES

Utilization of the present invention will become apparent to those skilled in the art from the disclosures made in the following description of a preferred embodiment of the invention as illustrated in the accompanying drawings, in which.

DETAILED DESCRIPTION OF THE DRAWINGS

Figure 1:
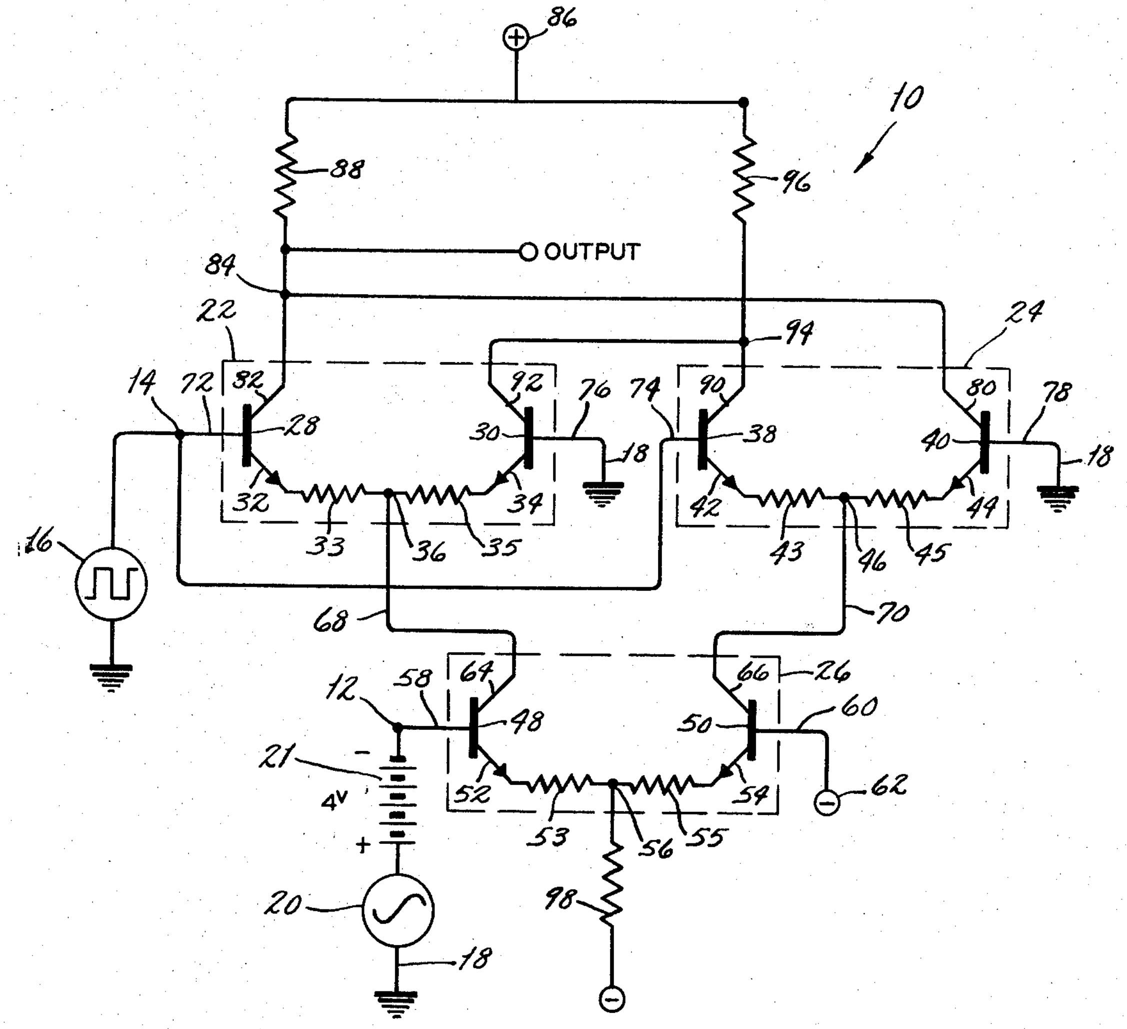
FIG. 1 is a schematic diagram of one form of the double-balanced modulator circuit of the present invention.

Referring now to the drawings, wherein like reference characters designate like or corresponding parts throughout the several views, there is shown in FIG. 1 the inventive circuit, which will first be described as a double-balanced modulator, generally designated 10. The double-balanced modulator 10 is shown as having two input terminals 12 and 14 to which input signals are connected. For purposes of illustrating the modulator operation, it may be assumed that a carrier signal source 16, illustrated as generating a rectangular wave form, is connected between a common reference potential (for example, ground potential) and the input terminal 14 of the modulator 10. Similarly, there is shown a modulating signal source 20, including a battery 21 to provide proper bias voltage, such as a negative 4 volts. The signal source 20 is illustrated as generating a sinusoidal wave form and is connected between the common reference potential 18 and the input terminal 12 of the modulator 10.

It should be understood that the signals provided by the signal source 16 and the signal source 20 need not necessarily be rectangular and sinusoidal as illustrated, but may be of any suitable waveform type which may be varied as desired. Furthermore, it should be understood that even though the signal supplied to input terminal 14 has been termed a "carrier signal" and that supplied to input terminal 12 has been referred to as a "modulating signal," the two signals may be interchanged without affecting the basic principles of operation of the double-balanced modulator 10.

The double-balanced modulator 10 includes three pairs of NPN transistors. The transistor pairs are indicated by the dashed lines 22, 24, and 26 and include two transistors connected in what is commonly referred to as the differential configuration. The transistor pair 22 includes two transistors 28 and 30, whose emitter electrodes 32 and 34, respectively, are connected together through impedances 33 and 35 at junction point 36. The transistor pair 24 includes two transistors 38 and 40, whose emitter electrodes 42 and 44, respectively, are connected through impedances 43 and 45 to a junction point 46. Similarly the transistor pair 26 includes two transistors 48 and 50, whose emitter electrodes 52 and 54, respectively, are connected through two impedances 53 and 55 to a junction point 56. By way of example, all of the transistors 28, 30, 38, 40, 48, and 50 may be of the 2N3563 type and preferably have substantially identical operating characteristics.

The base electrode 58 of transistor 48 is connected to the input terminal 12 of the modulator 10, and the base electrode 60 of the transistor 50 is connected to a source of negative potential 62 which, for example, may have a value of −4 volts. The collector electrodes 64 and 66 of the transistors 48 and 50 are connected by means of leads 68 and 70 to the junction points 36 and 46 respectively. It should be understood that although the second terminal 60 is shown as having no signal other than a voltage supply it is understood that a signal may also be applied thereto with the result that the currents in the lead 64, is essentially proportional to the difference in voltage between lead 58 and 60. Current in lead 66 is essentially the same as in lead 64 except that it is phase shifted. A similar explanation applies for transistor pairs 22 and 24.

The base electrodes 72 and 74 of the transistors 28 and 38 are directly coupled to the input terminal 14 of the double-balanced modulator 10. The base electrodes 76 and 78 of the transistors 30 and 40, respectively, are connected to the ground potential 18. The collector electrodes 80 and 82 of the transistors 40 and 28 are connected to a junction point 84 which may serve as the output terminal of the double-balance modulator 10.

This junction point 84 is coupled to a positive potential D.C. source 86 by means of a load impedance, which for purposes of illustration may be a load resistor 88 of, say, 51 ohms. Similarly, the collector electrodes 90 and 92 of the transistors 38 and 30 are connected to the junction point 94, which in turn is coupled to the positive potential D.C. source 86 by means of a load impedance 96. Like the load impedance 88, the load impedance 96 may be a load resistor of about 51 ohms. The positive potential D.C. source 86 may have a value of +12.6 volts.

As may be seen, a current-limiting resistor 98 is connected between the junction point 56 and a negative potential D.C. source, which, for example, may have a value of −12.6 volts.

The operation of the circuit as a modulator 10 will now be described with the transistor pair 26 operating in the linear mode and the transistor pairs 22 and 24 operating in the switching mode. It will become apparent hereinafter that these modes of operation may be reversed or modified without departing from the spirit of the invention. In operation and with no input signals applied to the input terminals 12 and 14 of the double-balanced modulator 10, the six transistors are biased in conventional fashion, so that transistors 28, 30, 38, and 40 are all conducting equally. In this no-signal condition, the current flowing from the positive potential D.C. source 86 through the load resistor 88, divides equally at junction point 84 and flows through the collector-emitter paths of transistors 28 and 40, leads 68 and 70, and the collector-emitter paths of transistor 48 and 50 to recombine at junction point 56. Similarly, the current flowing from the source 86 through the load resistor 96, divides equally at junction point 94 and flows through the collector-emitter paths of transistors 30 and 38, leads 68 and 70, and the collector-emitter paths of transistors 48 and 50, to recombine at junction point 56. Thus, the currents flowing in leads 68 and 70 are equal in magnitude.

Now assume that an alternating voltage signal is applied to the input terminal 14. Such signal will have a predetermined frequency and magnitude to alternately switch the transistors 28, 38 and 30, 40 between their conducting and non-conducting stages, respectively. That is, during the first half-cycle the input signal applied to the base electrodes 74, 72 of the transistors 28, 38 will first drive these transistors into their conducting state by rendering the bases positive with respect to the emitter electrodes 32, 42. As is well known, the differential-pair type connection of the transistor pairs 22 and 24 will cause the transistors 30 and 40 to be simultaneously switched to their non-conducting states. Thus, the current flow in lead 68 will correspond to the current flow in the collector-emitter path of the transistor 28, and the current flow in lead 70 will correspond to the current flow in the collector-emitter path of the transistor 38.

During the next half-cycle of the input signal, the base electrodes 74, 72 of the transistors 28, 38 will be driven negative with respect to their emitter electrodes 32, 42. When this happens, the transistors 28, 38 will be rendered non-conducting and their complementary, differential-pair transistors 30, 40 will be switched to their conducting state. In this condition, the current flow in lead 68 corresponds to the current flow through the collector-emitter path of transistor 30, and the current flow in lead 70 corresponds to the current flow through the collector-emitter path of transistor 40.

It may be seen that during both half cycles of the input signal, the current flow in leads 68 and 70 are equal and constant; the switching action of the transistor pairs 22, 24 assuring that the currents in leads 68 and 70 remain the same in the absence of an input signal applied to input terminal 12. It should be observed that whether the input signal applied to terminal 14 is sinusoidal or of the square-wave type does not matter.

Now assume that there is no input signal applied to the input terminal 14, but that an alternating voltage signal is supplied to the input terminal 12 of the double-balanced modulator 10. In this condition the currents flowing in leads 68 and 70 are no longer equal. However, the output signal from junction point 84 does not change, because one-half of the total current must flow through the transistors 28 and 38. The type of voltage input wave form, i.e. sinusoidal or square wave, again does not matter. It should be observed that this type of operation establishes the action of a balanced modulator inasmuch as the input frequency signals are substantially completely suppressed at the output.

The action of the double-balanced modulator 10 can be best visualized as follows: assume that the input signal to terminal 14 is a square wave of sufficient amplitude to turn one of the transistors of the transistor pairs 22 and 24 "off" while the other is turned "on." Such a signal A is shown in FIG. 2*a*. If the input signal A supplied to the base terminals 74, 72 of the transistors 28, 38 is positive with respect to the emitter electrodes 32, 42, the current flowing in lead 68 flows through transistor 28 and not through transistor 30. Similarly, in this condition transistor 38 is in its conducting state and transistor 38 and resistor 96 rather than through transistor 40 and load resistor 88. That is, it by-passes or is shunted around the output signal junction point 84. Thus, it may be seen that the output signal appearing at the junction point 84 corresponds to the current flow in lead 68 during the positive portion of the input signal.

During the negative portion of the input signal, the transistor 28 is switched to its non-conducting or "off" state and only the current in lead 70 flows through the transistor 40. That is, both the transistor 28 and 38 are switched to their "off" state while the transistors 30 and 40 are switched to their "on" state. In such condition the output signal appearing at junction point 84 corresponds to the current flow in lead 70.

Figure 2:
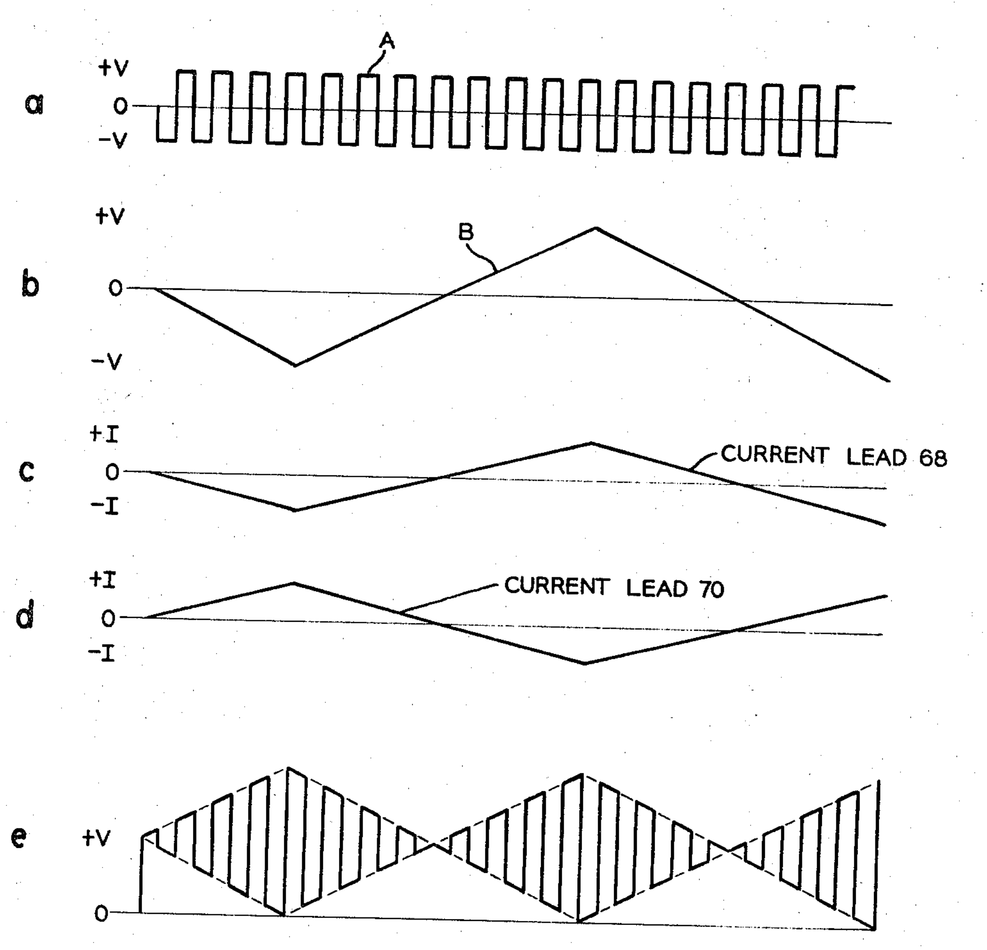
FIG. 2 is a graphical representation of the input and output waveforms illustrating the modulator operation of the circuit of FIG. 1.

As shown in FIG. 2 the signal applied to input terminal 12 is generally triangular in shape. When it is applied to the base electrode 58 of transistor 48 of the transistor pair 26, it produces at leads 68 and 70 the currents illustrated in FIGS. 2*c* and 2*d*, respectively, wherein the horizontal lines indicate the quiescent current. It should be noted that the transistors 48, 50 are operated in the differential linear mode as opposed to the transistor pairs 22, 24 which operate in the switch mode. Furthermore, the currents in leads 68 and 70 are equal in magnitude and 180° out of phase, as shown in FIGS. 2*c* and 2*d*.

The current-limiting resistor 98 connected to the emitter electrodes of the transistor 48 and 50 assures that the total current flowing in the two leads 68 and 70 remains constant.

The waveform shown in FIG. 2*e* represents the output signal which appears at junction point 84 when the input signal A is supplied to the input terminal 14 and the input signal B is supplied to the input terminal 12. It has been found that the output signal of FIG. 2*e* contains only the upper and lower sideband frequencies.

Figure 3:
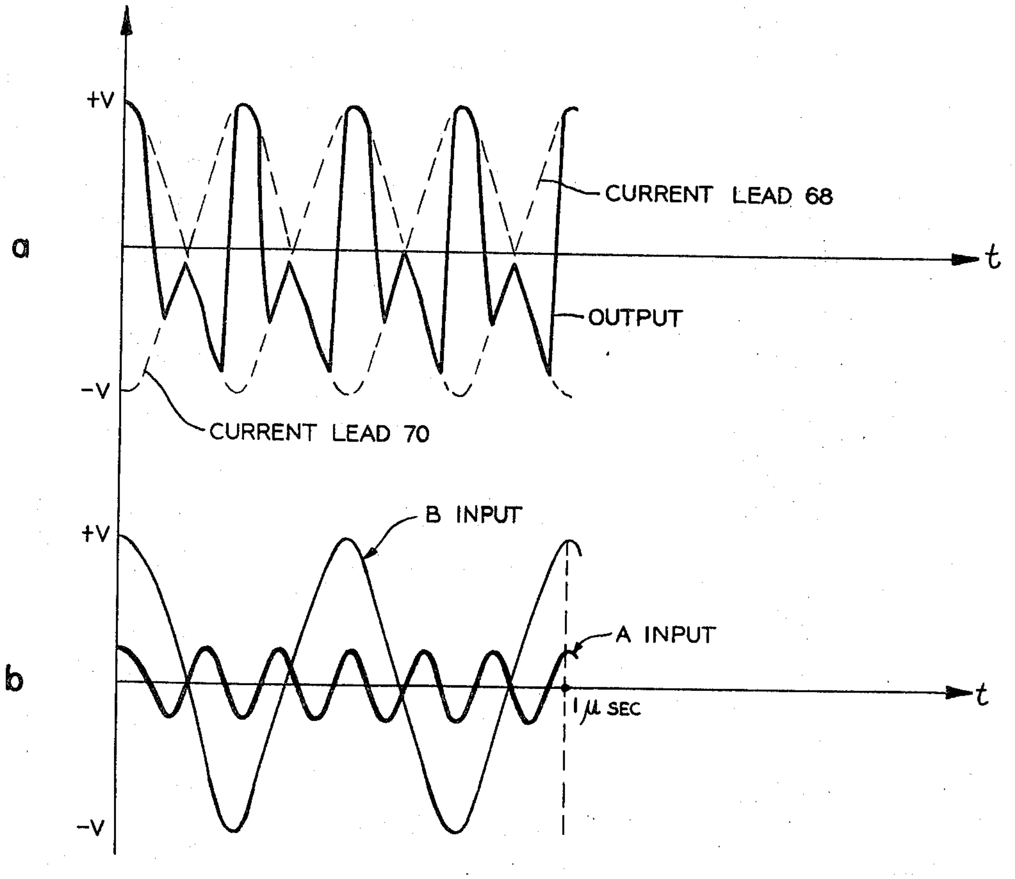
FIG. 3 is a graphical representation of another form of input waveforms illustrating the modulator operation of the modulator circuit of FIG. 1.

The operation of the double-balanced modulator 10 with two sinusoidal input signals is illustrated in FIG. 3. Specifically, in FIG. 3*b* there are shown two input signals A and B; the A input signal having a frequency of 6 megahertz (mHz.) and B input signal having a frequency of 2 mHz. In FIG. 3*a* the dashed lines represent the current signals resulting in leads 68 and 70 when the 2 mHz. B signal is applied to the input terminal 12 of the modulator 10. As was described hereinabove, the 6 mHz. signal A applied to the input terminal 14 of the modulator provides the switch-mode operation of the transistor pairs 22 and 24 of the modulator 10. It may be seen from FIG. 3*a* that the resultant output signal appearing at junction point 84 (indicated by the solid line) is a modulated signal produced by the modulation of the current signals in leads 68 and 70 by means of the A input signal.

It has been found that the double-balanced modulator of the present invention, when operating in the mode illustrated in FIG. 3, provides an output signal which consists of the upper and lower sidebands 4 and 8 mHz., 16 and 20, 22 and 26, mHz. etc. The input signals and harmonics thereof are suppressed from approximately 25 db to about 50 db. Furthermore, it has been found that the modulator 10 is frequency insensitive up to the cutoff frequency of the individual transistors used in the circuit; the transistors do not saturate. Modulation is achieved by the switching action rather than by using the non-linear circuit characteristics of the transistors. This enables one to accurately predict the amplitude of the output signal, since it will correspond directly to the operation of the transistor pair 26, and will not be substantially effected by the switching action of the transistor pairs 22 and 24. In addition, it would be observed that the modulator 10 does not employ any capacitors, inductors or transformers, and, therefore, may be readily fabricated in integrated circuit form.

As is well known in the art, modulator may be used to provide phase difference detection of two input signals by passing only the modulator components around zero frequency to the output. In this manner one may measure the phase difference between the two input signals.

With the balanced modulator of the present invention, phase detection is simpler due to the fact that the input frequencies are suppressed and only their side bands and related harmonics appear at the output. Since the input frequencies are closer to zero than all of the other frequency components which must be blocked for proper phase detector operation, they are the most difficult frequencies to block. However, in the case of the present invention wherein the input frequencies are suppressed by the modulator there is no problem associated with further preventing these frequencies from appearing at the output of a low pass filter.

Figure 4:
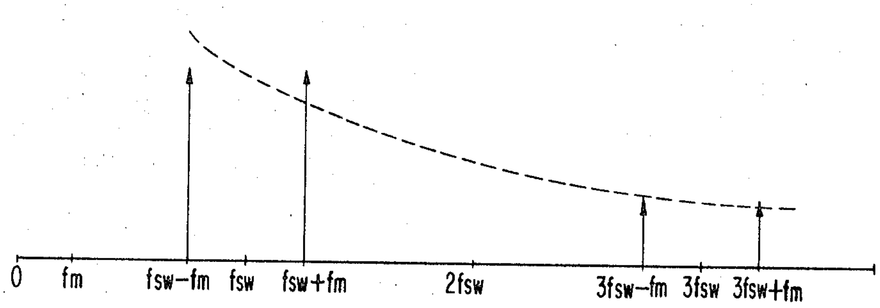
FIG. 4 is a frequency spectrum graph helpful in illustrating the operation of the double-balanced modulator as a phase detector.

An example of the above can be seen from the frequency versus amplitude diagram of FIG. 4. Assume that the input to the transistor pair 22 and 24 is a square wave of frequency $fsw$ (switching frequency) and that the input to the transistor pair 26 is a sine wave at the frequency $fm$ (modulating frequency). In accordance with the operation of the modulator, as described above, the components at frequencies $fm$ and $fsw$ will be suppressed and the sideband components $fsw-fm$ and $fsw+fm$ will appear at the output along with the related sidebands of the harmonics of the switching frequency. The upper and lower sidebands and the related sidebands of the third harmonics are illustrated in FIG. 4.

If $fsw=fm$ then the arrow (representing amplitude) at $fsw-fm$ will move over to the zero frequency range. This now represents the voltage level around zero frequency and the average or D.C. level will be dependent upon the phase difference between $fsw$ and $fm$ at the inputs. A low pass filter (not shown) connected at the modulator output will block all frequency component not near zero frequency to allow detection of the D.C. level of the zero frequency sideband.

Note that in the above case the upper sideband $fsw+fm$ has moved further away from zero. However, if the fundamental or input frequencies $fsw$ and $fm$ are not suppressed by the modulator itself then the low pass filter must be made very narrow in order to prevent the fundamental components from reaching the output in any significant quantity. Since the double balanced modulator of the present invention suppresses the fundamental frequencies, the requirements on the low pass filter used in phase detector operation are much simpler.

Although the example above assumes that $fsw=fm$ it will be apparent to one of ordinary skill in the art that phase difference measurement can be made when the equal frequencies are: $fm$ and a harmonic of $fsw$; $fsw$ and a harmonic of $fm$; harmonics of $fsw$ and $fm$. The purpose of the example above is only to illustrate the advantages of using the sideband suppressed modulator for a phase difference detection circuit or opposed to a modulator which does not suppress the sideband.

Although the circuit of the present invention provides modulator action, and is therefore referred to generally as a modulator circuit, it also provides the function of multiplying input amplitudes. In the prior art it has been very difficult to achieve an output proportional to $V_A \cdot V_B$. The present invention provides such an output for low level inputs with the resistors 33, 35, 43, 45, 52 and 55 reduced substantially to zero.

The action of the modulator as a signal level multiplier can be verified experimentally and also mathematically. A mathematical analysis of this function of the modulator circuit will be given in connection with FIG. 5.

Considering the two transistors 48 and 50 with their emitters connected together as shown, the sum of currents must be zero.

$$I = I_{B_1} + I_M + I_{B_2} + I_N$$

The base emitter junction may be considered a diode with the following relationship:

$$I_B = I_0\left(e^{\frac{q}{kt}(V_B - V_E)} - 1\right)$$

$I_0$ is usually a very small number typically 1 na. so that even for fractions of a microampere base current the contribution of the exponential completely overshadows that of (−1) so that $$I_B = I_0 e^{\frac{q}{kt}(V_B - V_E)}$$

$V_B - V_E$ = voltage across diode (for transistor its base emitter voltage)
$q$ = charge of electron
$k$ = Boltzman's constant
$T$ = absolute temperature The terms of $q$ and $k$ are constants, and temperature, although a variable, will be assumed constant. The collector current is given by the equation:

$$I_C = \beta I_B$$

Hence the collector current is:

$$I_C = \beta I_0 e^{\frac{q}{kt}}(V_B - V_E)$$

The emitter current is:

$$I_E = I_B + I_C = (1+\beta) I_0 e^{\frac{q}{kt}(V_B - V_E)}$$

To simplify the algebra, assume that $I_0$ and $\beta$ are the same for both transistors. Further assume that if $\beta$ is large $1+\beta \approx \beta$. This means that emitter current is approximately equal to collector current. Thus, $$I = I_{E_1} + I_{E_2} \approx I_M + I_N$$

The ratio $$\frac{I_M}{I_N} = \frac{\beta I_0 e^{\frac{q}{kt}(V_{B_1} - V_E)}}{\beta I_0 e^{\frac{q}{kt}(V_{B_1} - V_E)}} = \frac{e^{\frac{q}{kt}V_{B_1}} e^{-\frac{q}{kt}V_E}}{e^{\frac{q}{kt}V_{B_2}} e^{-\frac{q}{kt}V_E}}$$

$$= e^{\frac{q}{kt}(V_{B_1} - V_{B_2})}$$

$$I_M = I_N e^{\frac{q}{kt}(V_{B_1} - V_{B_2})}$$

however $$I_M = I - I_N$$

$$I_M = I e^{\frac{q}{kt}(V_{B_1} - V_{B_2})} - I_M e^{\frac{q}{kt}(V_{B_1} - V_{B_2})}$$

$$I_M = \frac{I e^{\frac{q}{kt}(V_{B_1} - V_{B_2})}}{1 + e^{\frac{q}{kt}(V_{B_1} - V_{B_2})}}$$

Also, by similar arguments, $$I_M = I \frac{1}{1 + e^{\frac{q}{kt}(V_{B_1} - V_{B_2})}}$$

Figure 5:
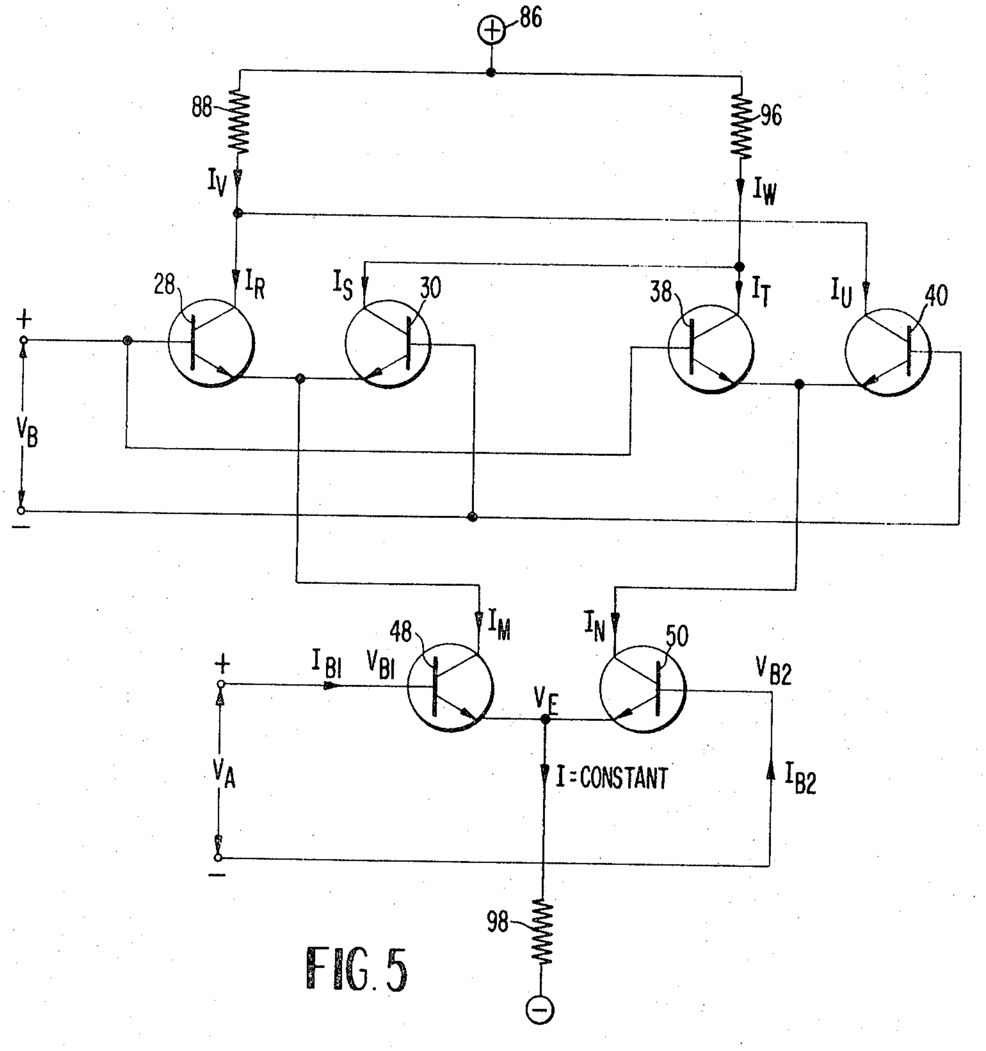
FIG. 5 is a schematic diagram of the circuit of the present invention used as a signal level multiplier.

Considering FIG. 5 as a whole, and assuming $$V_A = V_{B_1} - V_{B_2}$$

the following equations result:

$$I_M = \frac{I e^{\frac{q}{kt}V_A}}{1e + {}^{\frac{q}{kt}V_A}} \qquad I_N = \frac{1}{1 + e^{\frac{q}{kt}V_A}}$$

$$I_R = \frac{I_M e^{\frac{q}{kt}V_B}}{1 + e^{\frac{q}{kt}V_B}} \qquad I_U = I_N \frac{1}{1 + e^{\frac{q}{kt}V_B}}$$

$$I_V = I_R = I_U = \frac{I_M e^{\frac{q}{kt}V_B}}{1 + e^{\frac{q}{kt}V_B}} + 1_N \frac{1}{1 + e^{\frac{q}{kt}V_B}}$$

$$= \frac{I e^{\frac{q}{kt}V_A} e^{\frac{q}{kt}V_B}}{\left(1 + e^{\frac{q}{kt}V_A}\right)\left(1 + e^{\frac{q}{kt}V_B}\right)} + \frac{I}{\left(1 + e^{\frac{q}{kt}V_A}\right)\left(1 + e^{\frac{q}{kt}V_B}\right)}$$

$$I_V = \frac{I e^{\frac{q}{kt}V_A} e^{\frac{q}{kt}V_B} + 1}{\left(1 + e^{\frac{q}{kt}V_A}\right)\left(1 + e^{\frac{q}{kt}V_B}\right)}$$

To avoid writing many terms let $$\alpha = \frac{q}{kt} V_A$$

$$\gamma = \frac{q}{kt} V_B$$

$$I_V = I \frac{e^\alpha e^\gamma + 1}{(1+e^\alpha)(1+e)}$$

For the D.C. term of the output current $I_V$, $\alpha = \gamma = 0$, and the D.C. term is $$I_{V/DC} = \frac{I}{2}$$

Adding and subtracting this term, $$I_V = \frac{I}{2} + \left(\frac{I e^\alpha e^\gamma + 1}{(1=e^\alpha)(1=e^\gamma)}\right) - \frac{I}{2}$$

$$I_V = \frac{I}{2}\left[1 + \frac{(1-e^\alpha)(1-e^\gamma)}{(1+e^\alpha)(1+e^\gamma)}\right]$$

Dividing the top and bottom by $e^{+\alpha/2}$ and $e^{+\gamma/2}$ $$I_V = \frac{I}{2}\left[1 + \frac{\left(e^{\frac{\alpha}{2}} - e^{-\frac{\alpha}{2}}\right)\left(e^{\frac{\gamma}{2}} - e^{-\frac{\gamma}{2}}\right)}{\left(e^{\frac{\alpha}{2}} + e^{-\frac{\alpha}{2}}\right)\left(e^{\frac{\gamma}{2}} - e^{-\frac{\gamma}{2}}\right)}\right]$$

By the identity, $$\frac{e^x - e^{-x}}{e^x - e^{-x}} = \tan Hx$$

$$I_V = \frac{I}{2}\left[1 + \left(\tanh \frac{\alpha}{2}\right)\left(\tanh \frac{\gamma}{2}\right)\right]$$

substituting back $\alpha$ and $\gamma$, $$I_V = \frac{I}{2}\left[1 + \left(\tanh \frac{q^{V_A}}{2^{kt}}\right)\left(\tanh \frac{q^{V_B}}{2^{kt}}\right)\right]$$

using a power series expansion, $$\tanh x = x - \frac{x^3}{3} + \frac{2}{15}x^5 + \cdots$$

$$I_V = \frac{I}{2}\left[1 + \left(\frac{q}{2^{kt}}V_A - \frac{\left(2^{\frac{q}{kt}V_A}\right)^3}{3} + \cdots\right)\left(\frac{q}{2^{kt}}V_B - \frac{\left(2^{\frac{q}{kt}}V_b\right)^3}{3} + \cdots\right)\right]$$

$$I_V=\frac{I}{2}\left[1+\left(\frac{q}{2kt}\right)V_AV_B-\frac{\left(\frac{q}{2kt}\right)^4}{3}V_AV_B(V_A^2+V_B^2)+\cdots\right]$$

With the output reading adjusted to compensate for the quiescent term $I/2$, the output current reading is proportion to $V_AV_B$. It is apparent from the equation that the third term will cause a percentage error in the output reading. However, the low $V_A$ and $V_B$ the percent error will be small. By substituting numbers in the above equation it can be shown that a 10% error results with $V_A$ and $V_B$ at 20 mv., and smaller percent error results with lower input voltage levels.

Obviously, many modifications and variations are possible in light of the above description of the present invention. For example, the current-limiting resistor 98 may be replaced by a suitable resistor network consisting of a plurality of resistors, or any other suitable constant current source. Similarly, the transistor pairs 22 and 24 need not necessarily be operated in the switch mode. This would then eliminate the sidebands around the harmonics of the switching frequency and retain only the lower and upper sidebands. Furthermore, as stated hereinabove, the transistor pair 26 need not be operated in the linear mode. The modulator 10 will still function even though the transistor pairs 22, 24 are operated in the class A mode and the transistor pair 26 is operated in the switch mode. In addition, although transistors were given in the above examples, any three terminal device of proper characteristics may be used; for example, vacuum tubes, field effect transistors, MOS field effect transistors, light activated transistors and other devices known to persons skilled in the art. This may include fluid devices rather than electronic devices.

Therefore, the invention may be practiced otherwise than as specifically described.

What is claimed is:

1. A double-balanced modulator circiut, comprising
first and second load-impedance means, at least one of said load impedance means including an output terminal for such modulator circuit.
first input terminal means for receiving a first signal to be acted upon by such modulator circuit,
second input terminal means for receiving a second signal to be acted upon by such modulator circuit,
means electrically connected to said first input terminal means for producing a first current signal and a second current signal of substantially the same amplitude as and shifted in phase with respect to said first current signal, said first and second current signals corresponding to said first received signal, when a said first received signal is applied to said first terminal means,
first and second control means electrically connected to said second input terminal means and said means for producing first and second current signals to receive said first and second produced current signals respectively and selectively applying said first and second phase-shifted current signals to said first and second load-impedance means in accordance with said second received signal supplied to said second input terminal means,
whereby a signal having a plurality of sidebands generated by said first and second received signal applied to said first and second input terminal means, respectively, is provided at said output terminal, while the frequencies of said first and second received signals are substantially completely suppressed.

2. The double-balanced modulator circuit as defined in claim 1, wherein
said first and second current signals are shifted 180° in phase with respect to each other.

3. The double-balanced modulator circuit as defined in claim 2, wherein
said first and second current signal producing means, comprises
a first pair of transistors, each including base, emitter, and collector electrodes and having their emitter electrodes coupled to a resistive current-limiting circuit,
the base of one of said transistors being coupled to said first input terminal means and the base electrode of the other said transistor being coupled to a reference potential.

4. The double-balanced modulator circuit as defined in claim 3, wherein
said first and second control means, comprises
second and third pairs of transistors, each including base, emitter and collector electrodes, the emitter electrodes of each second and third transistor pair being coupled to the respective collector electrodes of said first transistor pair,
the base electrodes of one transistor of said second and third transistor pair being coupled to said second input terminal means and the base electrodes of said other transistors of said second and third transistor pair being connected to a reference potential,
the collector electrodes of said one transistor of said second and third transistor pairs being coupled respectively to said first and second load-impedance means, the output of the modulator being taken between said output terminal and said reference potential.

5. A double-balanced modulator circuit, comprising
first, second, and third pairs of transistors, each transistor having an emitter, a base, and a collector electrode, the emitter electrodes of each transistor pair being electrically coupled together, said coupled-together emitter electrodes of said first and second transistor pairs being electrically connected to respective collector electrode of said third transistor pair,
means for applying electrical power,
first load-impedance means electrically coupling the collector electrodes of one of said transistors of said first and second transistor pairs of said power supply means,
second load-impedance means electrically coupling the collector electrodes of the other of said transistors of said first and second transistor pairs to said power supply means,
a reference potential connected to the base electrodes of said other transistors of said first and second transistor pairs,
a first signal input terminal coupled to htebase electrodes of said one of sai dtransistors of said first and second transistor pairs,
a second signal input terminal coupled to the base electrode of one of said transistors of said third transistor pair, and
a current-limiting resistor coupled to the emitter electrodes of said third transistor pair.

6. The double-balanced modulator circuit as defined in claim 5, wherein
all of said transistor pairs are biased to operate in their linear mode of operation, thereby to generate only two sideband signals at the modulator output.

7. The double-balanced modulator circuit as defined in claim 5, wherein
all of said transistor pairs are biased to operate in their switching mode, thereby to generate a plurality of sideband signals at the modulator output.

8. A circuit, comprising first and second load-impedance means, first input terminal means for receiving a first input signal, second input terminal means for receiving a second input signal, means electrically connected to said first input terminal means for producing a third signal and a fourth signal shifted in phase with respect to said third signal, said third and fourth signals corresponding to said first input signal, when a first input signal is applied to said first input terminal means, first and second control means electrically connected to said second input terminal means and said third and fourth signal producing means for receiving said third and fourth phase-shifted signals respectively and selectively applying said third and fourth phase-shifted signals to said first and second load-impedance means in accordance with said second input signal, said means for producing third and fourth phase shifted signals comprise, a first pair of transistors having base, emitter and collector terminals, said emitter terminals being connected to one another, biasing means for providing operating potentials to said transistors and for drawing a substantially constant current out of said emitter connection, and means for differentially connecting said first input signal between the base terminals of said first pair of transistors.

9. A circuit as claimed in claim 8 wherein said first control means comprises, a second pair of transistors having base, emitter and collector terminals, said emitter terminals being connected to the collector terminal of one transistor of said first pair of transistors, said collector terminals of said second pair of electrodes being connected to said first and second load means respectively, and means for differentially connecting said second input signal between the base terminal of said second pair of transistors.

10. A circuit as claimed in claim 9 wherein said second control means comprises a third pair of transistors having base, emitter and collector terminals, said emitter terminals being connected to the collector terminal of one transistor of said first pair of transistors, said collector terminals of said second pair of electrodes being connected to said second and first load means respectively and, means for differentially connecting said second input signal between the base terminal of said third pair of transistors.

References Cited

UNITED STATES PATENTS

| | | | |
|---|---|---|---|
| 3,170,125 | 2/1965 | Thompson | 330—30DX |
| 3,241,078 | 3/1966 | Jones | 330—30DX |
| 3,243,707 | 3/1966 | Cottrell | 332—44X |
| 3,422,283 | 1/1969 | Murray et al. | 307—242X |
| 3,445,780 | 5/1969 | Beelitz | 330—30DX |

ALFRED L. BRODY, Primary Examiner

U.S. Cl. X.R.

307—242; 325—137; 330—15, 30

UNITED STATES PATENT OFFICE
CERTIFICATE OF CORRECTION

Patent No. 3,550,040 Dated December 22, 1970

Inventor(s) Robert R. Sinusas

It is certified that error appears in the above-identified patent and that said Letters Patent are hereby corrected as shown below:

Column 7, line 2 - "52" should be "53"
line 53 - Under the line in first part of equa[t]
"$(V_{B_1}$" should be "$(V_{B_2}$"
line 55 - "$V_{B2}$" should be "$V_{B_2}$"

Column 8, line 11 - "le+" should be "l+e"
line 40 - "$I_{V/DC}$" should be "$I_V$ DC"
line 56 - "tan H $x$ " should be "tanh $x$ "
line 75 - $\frac{\left(\frac{q}{2kt} V_b\right)^3}{3}$ should be $\frac{\left(\frac{q}{2kt} V_b\right)^3}{3}$ Column 9, line 1 - $\left(\frac{q}{2kt}\right)$ should be $\left(\frac{q}{2kt}\right)^2$
line 12 - "the low" should be "for low"
line 16 - "mv" should be "mV"
line 42 - "circiut" should be "circuit"
line 44 - Period should be a comma Column 10, line 38 - "electrode" should be "electrodes"
line 51 - "htebase" should be "the base"
line 52 - "sai dtransistors" should be "said transistor Signed and sealed this 30th day of March 1971.

(SEAL)
Attest:

EDWARD M.FLETCHER,JR.
Attesting Officer

WILLIAM E. SCHUYLER, JR
Commissioner of Patents